United States Patent [19]

Nikjou

[11] Patent Number: 5,347,558
[45] Date of Patent: Sep. 13, 1994

[54] INPUT FREQUENCY CONVERTER TO INCREASE INPUT FREQUENCY RANGE OF A SYNCHRONOUS DELAY LINE

[75] Inventor: Bobby B. Nikjou, Tempe, Ariz.

[73] Assignee: Intel Corporation, Santa Clara, Calif.

[21] Appl. No.: 139,196

[22] Filed: Oct. 20, 1993

[51] Int. Cl.$^5$ ............................................. H03K 21/00
[52] U.S. Cl. ....................................... 377/47; 328/155; 328/15
[58] Field of Search ................................... 328/47–48, 328/155; 377/47

[56] References Cited

U.S. PATENT DOCUMENTS

| | | | |
|---|---|---|---|
| 4,443,887 | 4/1984 | Shiramizu | 377/48 |
| 4,545,063 | 10/1985 | Kaminaru | 377/48 |
| 4,980,585 | 12/1990 | Bazes | 307/529 |
| 4,991,187 | 2/1991 | Herold et al. | 377/48 |

*Primary Examiner*—Margaret Rose Wambach
*Attorney, Agent, or Firm*—Blakely Sokoloff Taylor & Zafman

[57] ABSTRACT

A front end scalar to a frequency multiplier such as a synchronous delay line (SDL) allows the SDL to operate at a single clock frequency for all multiplier coefficients and input frequencies and provides for maximum SDL design margins. A frequency multiplier of this type relies upon a feedback voltage to maintain a desired output clock frequency. So long as the input clock frequency is within predetermined limits, the feedback voltage will maintain the output frequency at a desired frequency for which the SDL has been optimized. As the input frequency approaches the upper or lower limit for which an SDL basic building block has been optimized, it may become impossible for an SDL to provide frequency lock since control voltage is already below or above $V_{cc}/2$ due to a lower or a higher input frequency. The invention operates to ensure that the input frequency to the SDL is always close to the frequency for which the SDL has been optimized by changing the input frequency to a frequency which is at or near the frequency for which a SDL has been optimized and thereby eliminate the input frequency dependency of the SDL.

5 Claims, 5 Drawing Sheets

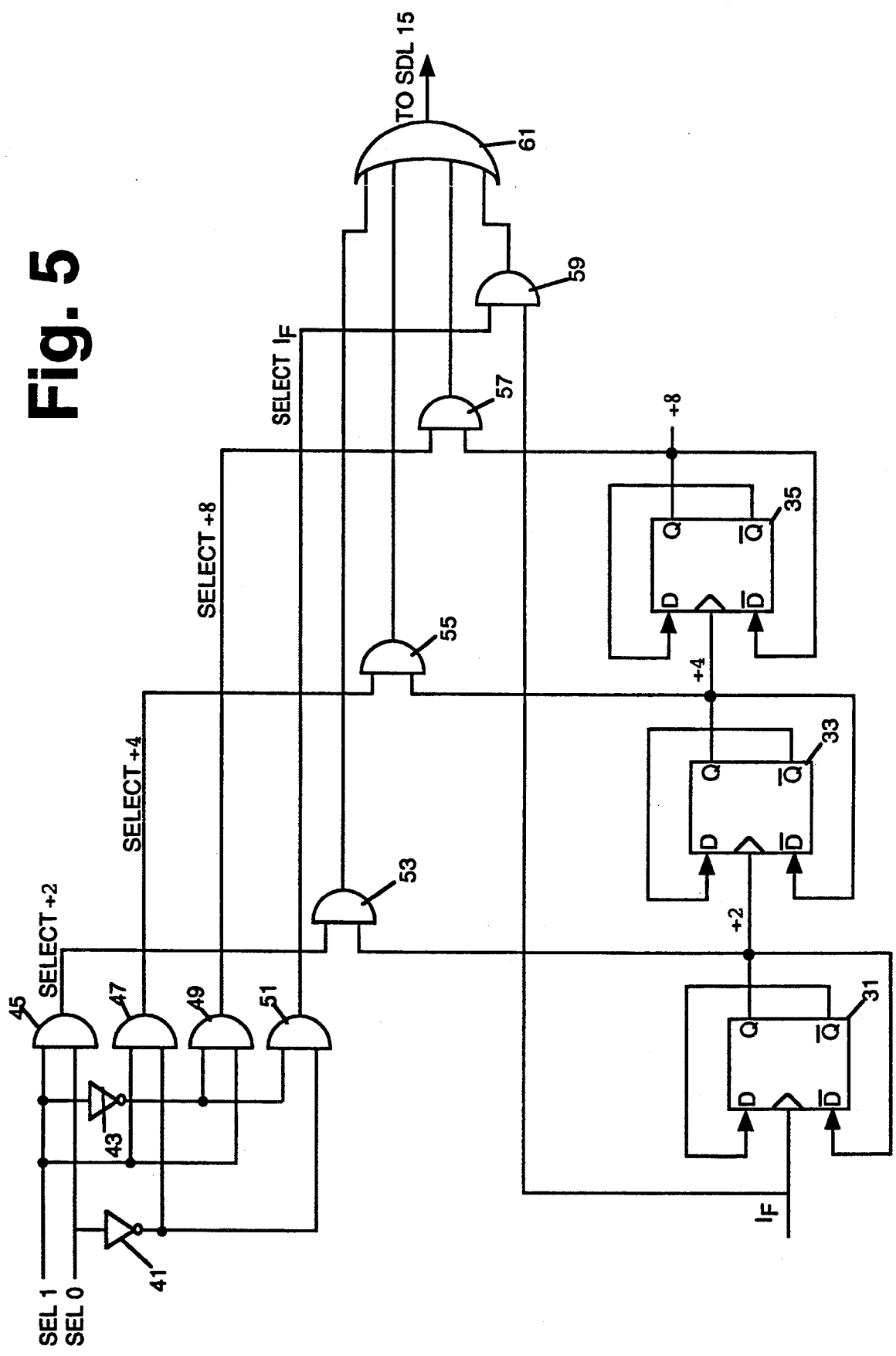

INPUT FREQUENCY CONVERTER TO INCREASE INPUT FREQUENCY RANGE OF A SYNCHRONOUS DELAY LINE

BACKGROUND OF THE INVENTION

As the operating frequencies of microprocessors go beyond 25 MHz clock speeds, a typical design may obtain the clock signals needed by the processor and its peripherals by multiplying a low speed clock source rather than dividing a high speed clock source. While a clock source having a speed exactly equal to the require clock speed could be used, such an approach is usually not utilized since 1) higher frequently crystals cost more; 2) special oscillator circuits would need to be designed; and 3) external RC components would need to be added to isolate the fundamental frequency from its overtones (harmonics). Although, in general, it is possible to obtain a reliable lower speed clock from a higher speed clock source by dividing a higher speed crystal source, due to the expense of obtaining a high speed clock oscillator circuit, most system designers rely upon a clock source with a lower than required speed clock and multiply that clock to obtain the desired higher clock speed. Additionally, if the input clock source and output clock need to be completely synchronized, the multiplication technique is preferred since techniques used to divide a high speed clock to obtain a lower clock speed usually result in the output clock not being synchronized with the input clock thereby requiring additional circuitry to accomplish synchronization.

To perform the multiplication function on an input clock source, a digital or analog phase locked loop (PLL) or a synchronous delay line (SDL) may be utilized. A suitable SDL for this purpose is described in U.S. Pat. No. 4,980,585. See FIGS. 1A and 1B of the patent which describe a suitable PLL and FIGS. 2–9 of the patent which describe a suitable SDL and supporting elements.

BRIEF SUMMARY OF THE INVENTION

The present invention is a front end to a frequency multiplier such as a SDL which operates to increase the reliable operational range of the SDL's basic building block, i.e., a cross coupled NAND gate and associated MOS capacitors in the SDL array. A frequency multiplier of this type relies upon a feedback voltage to maintain a desired output clock frequency. So long as the input clock frequency is within predetermined limits, the feedback voltage will maintain the output frequency, with a very tight tolerance level, for which the SDL building block has been optimized. As the input frequency approaches the upper or lower limit for which an SDL basic building block has been optimized, it may become impossible for an SDL to maintain frequency lock over the entire range of operating conditions since the control voltage is already below or above $V_{cc}/2$ due to a lower or a higher input frequency. For example, assuming a SDL that is optimized for an input frequency $I_f$, and programmed for an output frequency $O_f$ and a feedback voltage $V_{cntrol}$, at the optimal point, $V_{cntrol}=V_{cc}/2$. As $I_f$ varies, the control voltage $V_{cntrol}$ is either lower (when $I_f$ is greater than the optimized $I_f$) or higher than $V_{cc}/2$ (when $I_f$ is less than the optimized $I_f$). Since the compensating control voltage i.e., $V_{cntrol}$, cannot exceed the $V_{cc}$ or $V_{ss}$ rails, it may not be possible for the SDL to remain in lock as conditions change due to temperature, voltage or process variations.

BRIEF DESCRIPTION OF THE DRAWINGS

FIG. 5 is a logic gate level diagram showing an implementation of the present invention.

DETAILED DESCRIPTION OF THE INVENTION

Although the use of a SDL is well known as a technique for obtaining a desired output clock which is a multiple of an input clock, SDLs are difficult to design and, once designed to be optimized for a specific input frequency, are capable of reliably operating only within a relatively narrow range. For example, for a designed for input clock frequency of 20 MHz., i.e., a SDL reference clock equal to 10 MHz, a particular SDL may only be able to reliably handle input frequencies between approximately 10 MHz and 30 MHz., i.e., SDL cutoff and saturation frequencies as explained in U.S. Pat. No. 4,980,585. Of course, a particular design may have a greater upper and/or lower limit depending on the number of taps and the size of the MOS capacitors in the basic building block of the SDL. However, outside of these limits, and sometimes even within these limits depending on temperature, voltage and process variations, the reliability of the output clock and the amount of its fluctuation with respect to the SDL reference clock, i.e., jitter, may not be sufficient for the clock speed requirements of present day microprocessors. For this reason, when a system is being designed for a particular microprocessor running at a particular clock speed, part of the design must specify the required input clock oscillator frequency. As such, only input clock frequencies that fall within a band around the optimized frequency can be used reliably with such SDL to produce a desired internal frequency for a microprocessor. However, by using the present invention, the permitted input clock frequency is not so constrained.

Figure 1:
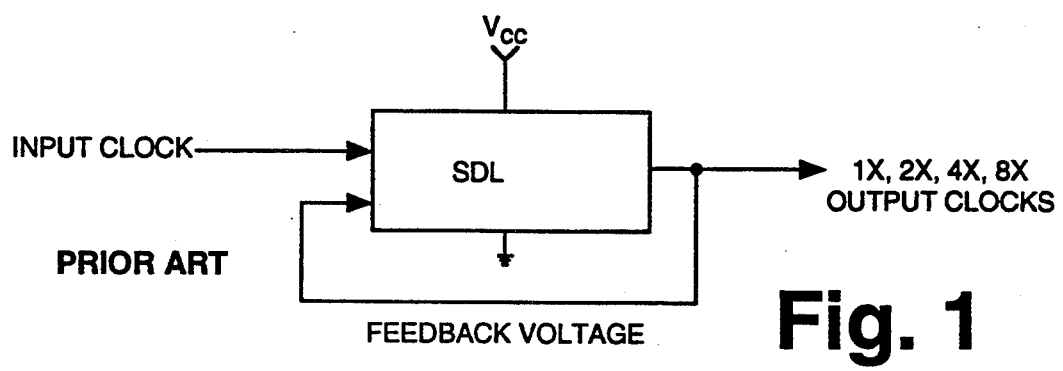
FIG. 1 is a block diagram showing a prior art SDL.
Figure 3A:
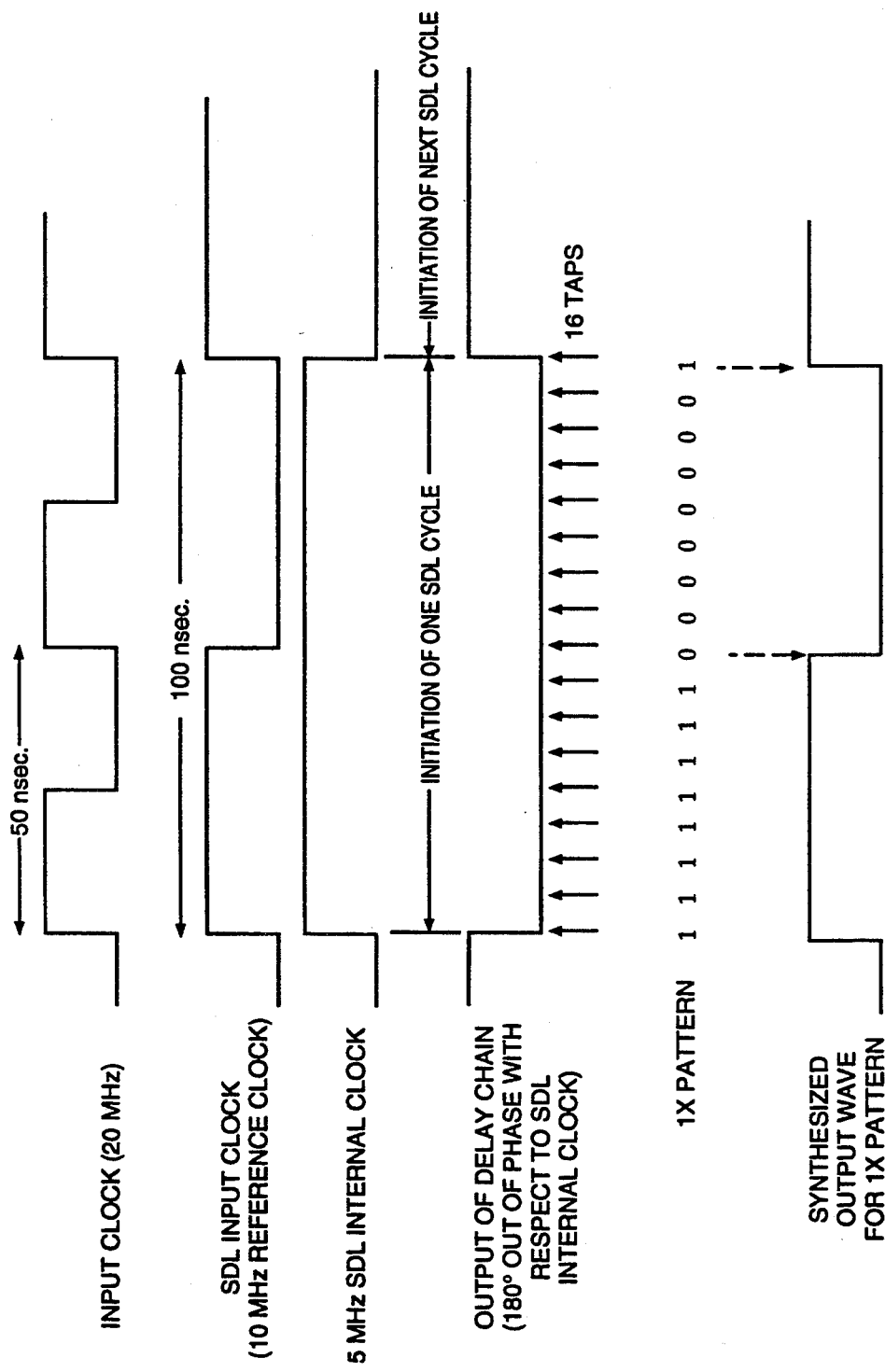
FIG. 3a shows the various clock signals used by and generated by the invention.

Referring for example to FIG. 1, an SDL is shown which produces an output clock frequency which is, for example, $1\times, 2\times, 4\times$ and $8\times$ the SDL reference clock frequency. An SDL is optimized so that it produces the desired output frequency from a particular input frequency by synthesizing appropriate patterns. At the optimized input frequency, an SDL is in the lock state and the feedback voltage (error voltage or control voltage) is $V_{cc}/2$. For other input frequencies, the feedback voltage will be higher or lower than $V_{cc}/2$ to compensate for the different input frequency (different frequency from ideal frequency) and thereby maintain the SDL in the lock state. Such optimization enables the circuit to produce the desired output frequency notwithstanding circuit to circuit process, voltage and temperature variations. However, as the feedback voltage varies from $V_{cc}/2$ as needed to compensate for an input frequency other than the optimal input frequency, the circuit may not have sufficient noise immunity to process, temperature or voltage variations in order to correct itself so as to produce a reliable, low jitter, output frequency. While a SDL could be designed to be optimized for some other desired input frequency, due the difficulty of obtaining a design which will function properly, the tendency is to use a SDL design which is known to work and utilize an input clock source at or near the optimized input frequency. For example, for an SDL designed to operate at an input frequency of 20 MHz (50 nsec period) with 16 taps (delay elements) at 5 v, the SDL basic building blocks are designed and optimized with respect to the SDL reference clock i.e., 10 MHz (100 nsec period) as shown in FIG. 3a. However, other input frequencies that are close to the optimized input frequency (e.g., in the range of 15 to 25 MHz) will also work, although such other input frequencies would be more likely to result in SDL failure due to process, voltage and temperature variations.

The basic functionality of a SDL relies on delaying the SDL internal clock, i.e., 5 MHz, through its delay elements, in the case shown in FIG. 3a, 16 taps, such that the output of this delay chain is 180° out of phase with respect to the SDL internal clock. If the output of the delay elements (other than the output of the SDL's final stage) is not exactly 180° out of phase with respect to the SDL internal clock, then the control voltage will either increase or decrease so that the two signals become exactly out of phase. When the output of the SDL delay chain is exactly 180° out of phase with respect to the SDL internal clock, the SDL is said to be in the "lock state". For an optimized SDL, this condition corresponds to a feedback or control voltage $V_{cntrol} = V_{cc}/2$.

For an input frequency of 20 MHz (50 ns), the SDL cycle initiates every 100 ns, i.e., for every high to low or low to high transition of the SDL internal clock. In this case, since there are 16 taps in 100 nsec, each tap must have a delay of 100 nsec/16=6.25 nsec.

The above described SDL building block is made of a cross-coupled NAND gate and a combination PMOS and NMOS capacitors as described in U.S. Pat. No. 4,980,585.

As discussed above, each delay element needs to provide a delay of 6.25 nsec. This delay is broken into two portions 1) gate or logic delay (from the NAND gate); and 2) capacitive delay from the NMOS and PMOS capacitors.

For a given process, the logic delay may be on the order of 1 nsec. Thus, the remainder i.e., 5.25 nsec. must come from capacitive loading from an MOS capacitor.

The voltage that charges or discharges this MOS capacitor is $V_{cntrol}$. The size of this MOS device which is configured to act as a capacitor is picked so that when $V_{cntrol} = V_{cc}/2$ it provides 5.25 nsec of the delay.

This example clearly shows the dependency of an SDL basic building block on the input frequency which determines the tap-to-tap delay.

Now, assume that there is a process shift or a temperature gradient or a voltage spike/dip. In this case, the output of the SDL chain may not remain in lock with respect to the SDL reference clock.

In this case, the control voltage will either increase or decrease so that the SDL chain output is maintained 180° out of phase with the internal clock. The effect of $V_{cntrol}$ increasing or decreasing causes the MOS capacitor to either charge (causing more delay, i.e., >5.25 nsec) or discharge (causing less delay i.e., <5.25 nsec) thus maintaining the SDL in lock state.

The important thing to note is that the SDL building block is designed for a specific optimum frequency so that in equilibrium i.e., when locked, in the absence of any process, voltage or temperature skew, the control voltage is at $V_{cc}/2$. This means that to maintain the desired output frequency, the control voltage can favorably decrease toward $V_{ss}$ rail (less delay) as well as increase to $V_{cc}$ rail (more delay).

If the input frequency of the SDL, i.e., the SDL reference clock, is not at the optimum frequency, the SDL will still function, but at equilibrium condition the control voltage is either lower than $V_{cc}/2$ (corresponding to the case where the input clock is higher than the SDL optimum frequency) or higher than $V_{cc}/2$ (corresponding to the case where the input clock is lower than the SDL optimum frequency).

Assume that the input clock to the SDL instead of 20 MHz is 15 MHz (66 nsec period). In this case, the SDL reference clock is at 7.5 MHz (133 nsec) and consequently the SDL internal clock is 3.75 MHz. For a 16 tap array, each delay element needs to be 133 nsec/16=8.31 nsec. Again, this delay will come from
1) logic NAND=1 nsec; and
2) MOS capacitor=7.31 nsec.

This means that the MOS capacitor must be charged more i.e., from 5.25 nsec. to 7.31 nsec. so that it can compensate for a lower input frequency. In this case, the $V_{cntrol}$ is higher than $V_{cc}/2$ i.e., 3.0 volts (not $V_{cc}/2$ or 2.5 volts any longer).

Now, if an adverse condition takes place, i.e., process skew, voltage or temperature shift, the control voltage is not symmetric with respect to the $V_{cc}$ rail and the $V_{ss}$ rail and has more room to go towards the $V_{ss}$ rail rather than the $V_{cc}$ rail. If the input frequency causes the $V_{cntrol}$ of the SDL to be very close to one rail, then there is no room left for any correction due to adverse conditions due to process, temperature or voltage variations.

In the invented front end, the input frequency dependency is minimized so that the circuit becomes more robust to real life parameters that cannot be completely controlled.

This means that any input frequency can be used so as long as when divided, it can produce a SDL reference clock which is close to the frequency for which the SDL was optimized i.e., 10 MHz. For example, a 43 MHz crystal should be divided by 4 to get the 10.75 MHz SDL reference clock (although $V_{cntrol}$ is not exactly equal to $V_{cc}/2$, it is sufficiently close to it).

By using the present invention, processors which need an SDL controlled clock need not be concerned with the availability of a clock source of a particular frequency since to accommodate a specific frequency all that may need to be redesigned is the front end. However, since the invented front end may be implemented using digital logic, for example, decoders, dividers and inhibit circuits, there is no risk associated with producing such design.

The invented front end results in a feedback voltage in the SDL which varies only as a result of process variations and not as a function of input frequency. By eliminating one element which may cause unreliable operation, overall reliability is improved. The present invention eliminates the dependency of feedback control voltage from the input frequency by ensuring that the SDL internal clock is a fixed, predetermined frequency. In this manner, the SDL always operates at the frequency it has been optimized for so that process and voltage variations do not adversely impact the generated output frequency.

Figure 2:
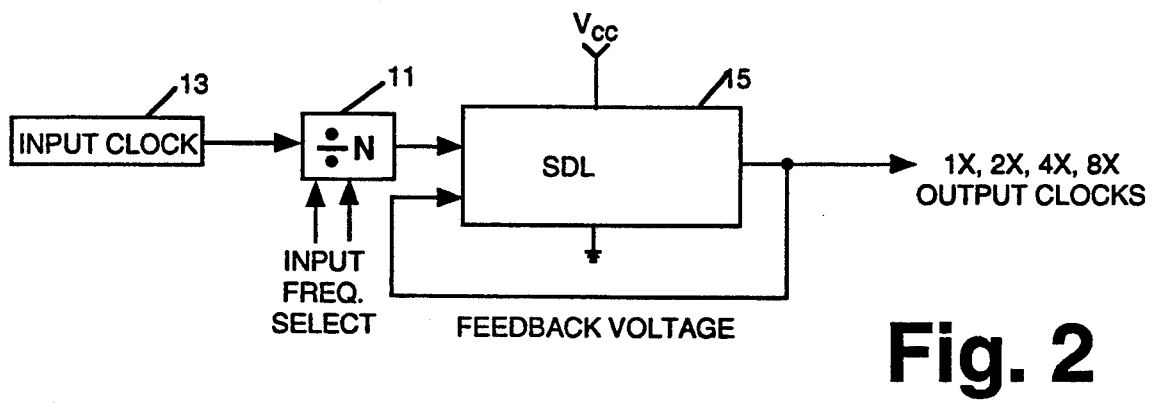
FIG. 2 is a block diagram showing the relationship between the invention and a prior art SDL.

As shown in FIG. 2, the present invention 11 is disposed between an input frequency source 13 such as a crystal oscillator and a SDL 15 and operates so as to produce a fixed frequency which it provides as the input to the SDL, i.e., the SDL reference clock. In operation, the invention operates by decoding an input selection set of signals and dividing the input clock to produce a clock signal of a predetermined frequency.

Figure 3B:
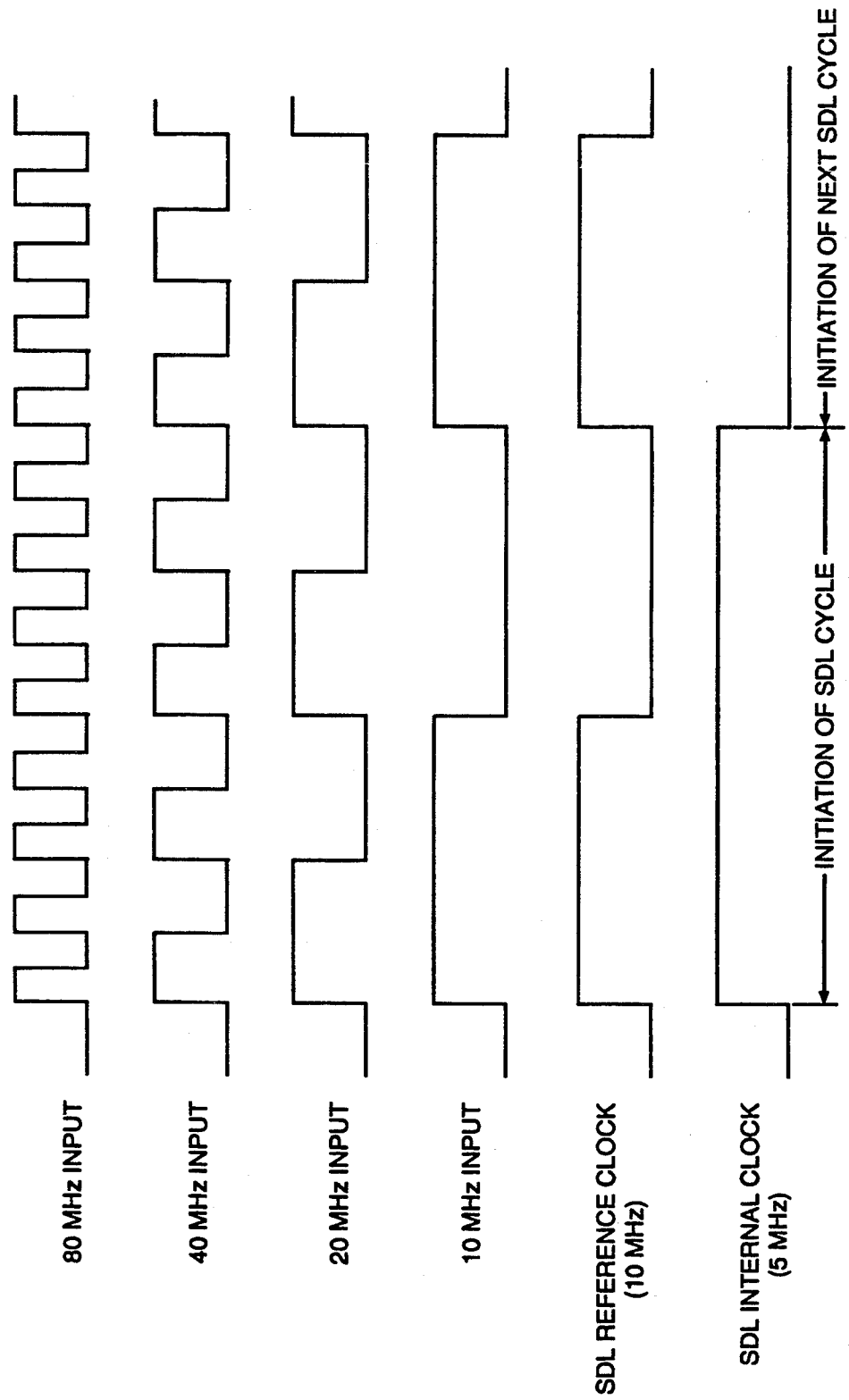
FIG. 3b shows the relationship between the SDL reference clock and various input frequencies which may be encountered.
Figure 4:
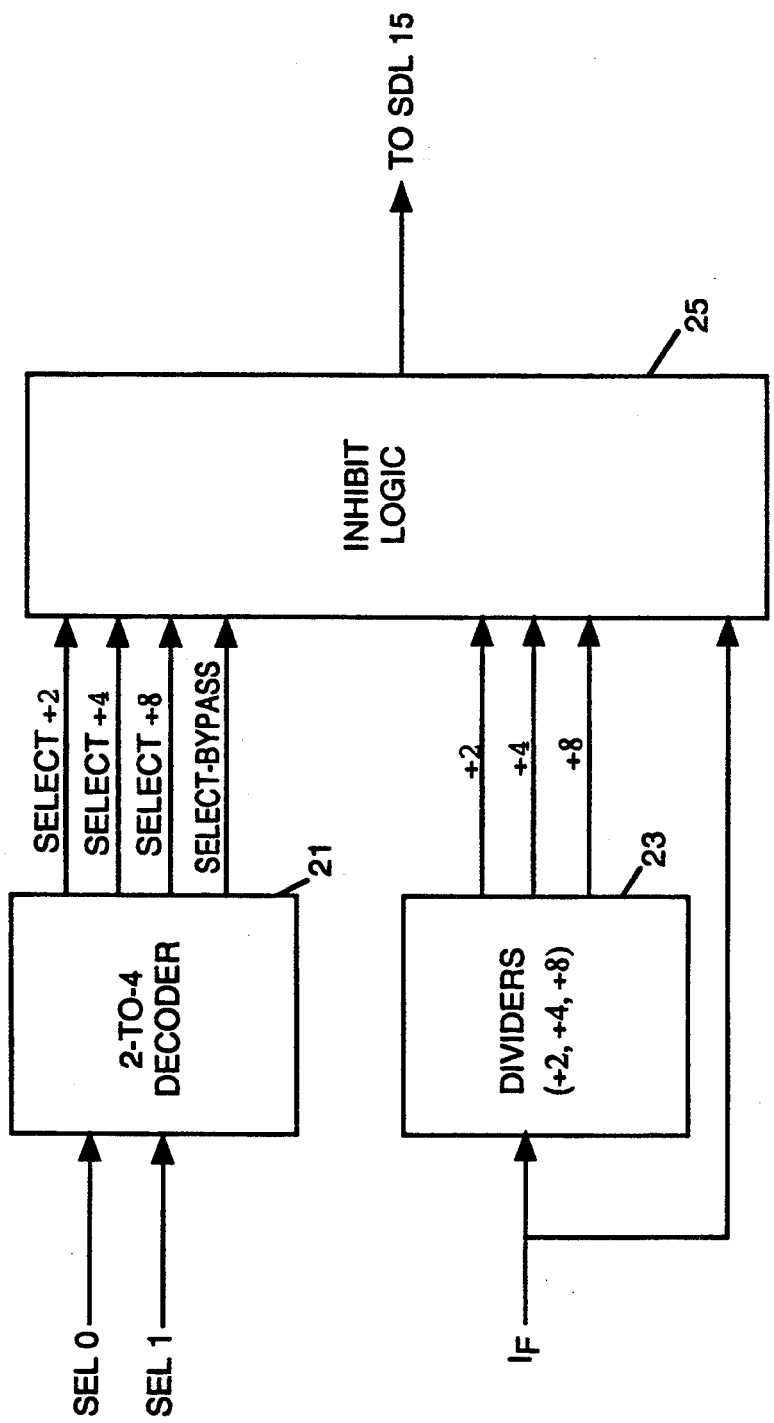
FIG. 4 is an overview block diagram showing an implementation of the present invention.

As shown in FIG. 4, the invention may be implemented using a decoder 21, a set of dividers 23 and inhibit logic 25 which operate to divide a selected input frequency to produce a predetermined desired frequency which is input to the SDL. For example, assuming possible input frequencies from a set of crystals having frequencies of 10 MHz, 20 MHz, 40 MHz and 80 MHz, a set of two input select signals are decoded to yield four control signals which are input to inhibit logic 25. The inhibit logic selects i) one of the three outputs from the divider to produce a frequency of 10 MHz from the 20 MHz, 40 MHz and 80 MHz input frequencies respectively by operation of frequency dividers 23; or ii) the input frequency of 10 MHz as the reference clock input to the SDL. Typically, the input select signals to decoder 21 may be obtained by a jumper connection (wire option), but any suitable mechanism may be employed to obtain the select signals. In the case of a 43 MHz input signal, the front end circuit needs to be configured to divide the input frequency by 4 and for the inhibit circuit to pass the resulting clock signal to the SDL. Shown in FIG. 3b is the relationship of various input frequencies with respect to the SDL reference clock. Although the input clocks and the SDL reference clock are shown in FIG. 3b as having 50% duty cycles, such clocks may have duty cylcles other than 50%. However, the SDL internal clock will always have a 50% duty cycle.

Decoder 21 may be implemented by inverters 41 and 43 and AND gates 45, 47, 49 and 51 as shown in FIG. 5. Frequency dividers 23 may be implemented using a set of master slave flip-flops 31, 33 and 35 as shown in FIG. 5. Inhibit logic 25 may be implemented using a set of AND gates 53, 55, 57 and 59 and OR gate 61 as shown in FIG. 5.

Of course, a different set of frequency dividers could be used to accommodate different desired clock sources and desired SDL reference clock, and a different decoder and inhibit logic could be used to select from a number other than four input clocks without departing from the invention defined by the following claims.

I claim:

1. A front end to a frequency multiplier which increases the reliable operational input frequency range of the frequency multiplier adapted to operate using a predetermined optimal input frequency, said front end comprising:
   a) a decoder for generating a set of select signals from a smaller set of control signals;
   b) a frequency divider means coupled between the frequency converter and an input clock source for generating a predetermined set of clock frequencies by dividing the input clock source such that one of said set of predetermined clock frequencies is substantially equal to the predetermined optimal input frequency;
   c) inhibit circuit means for selecting the one clock frequency from said set of predetermined clock frequencies which is substantially equal to the predetermined optimal input frequency based upon said set of select signals.

2. The front end defined by claim 1 wherein said frequency multiplier is a synchronous delay line.

3. The front end defined by claim 2 wherein said frequency divider means comprises a plurality of frequency dividers coupled to said input clock source.

4. The front end defined by claim 3 wherein said plurality of frequency dividers are a plurality of master-slave flip-flops with a first one of said master-slave flip-flops being coupled to said input clock source.

5. The front end defined by claim 1 wherein set of control signals are generated by a jumper selection.

* * * * *